United States Patent [19]

Hattori et al.

[11] Patent Number: 4,664,524

[45] Date of Patent: May 12, 1987

[54] OPTICAL SELF-ALIGNMENT SYSTEM

[75] Inventors: Shuzo Hattori, Aichi; Yoshiyuki Uchida, Nagoya, both of Japan

[73] Assignee: The President of Nagoya University, Aichi, Japan

[21] Appl. No.: 652,452

[22] Filed: Sep. 19, 1984

[30] Foreign Application Priority Data

Sep. 24, 1983 [JP] Japan .............................. 58-176835

[51] Int. Cl.$^4$ ............................................ G01B 11/00
[52] U.S. Cl. ............................... 356/401; 250/237 G; 250/548; 356/356; 356/400
[58] Field of Search ................ 356/354, 363, 399–401, 356/356; 250/237 G, 548, 561

[56] References Cited

U.S. PATENT DOCUMENTS

| | | | |
|---|---|---|---|
| 3,861,798 | 1/1975 | Kobayashi et al. | 356/363 |
| 3,867,038 | 2/1975 | Westell | 356/400 |
| 4,200,395 | 4/1980 | Smith et al. | 356/363 |
| 4,371,264 | 2/1983 | Lacombat et al. | 356/363 |

OTHER PUBLICATIONS

Toril et al., *Journal of the Optical Society of America*, vol. 68, No. 12, Dec. 1978, pp. 1716–1731.

*Primary Examiner*—F. L. Evans
*Attorney, Agent, or Firm*—Bruce L. Adams; Robert E. Burns; Emmanuel J. Lobato

[57] ABSTRACT

An optical self-alignment system comprises a laser source, a substrate with a first diffraction grating for receiving laser beams from the laser source, a substrate with a second diffraction grating disposed within Fresnel zone of the first diffraction grating, and a photoelectric detector for detecting Fraunhofer diffraction ray of 0th order by the second diffraction grating. In order to adjust the relative position between the two substrates in orthogonal directions to the laser beams at high accuracy, the first and second diffraction gratings are provided with two groups of combined diffraction gratings so that phase difference of 180° is produced in the Moire signals, maximum displacement point of Moire signal is detected with respect to relative position displacement of the diffraction gratings, and the substrates are positioned at maximum intensity displacement of two groups of the Moire signals.

26 Claims, 12 Drawing Figures

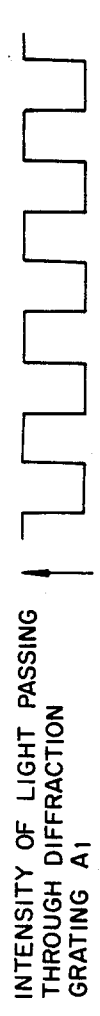
FIG. 4(a) INTENSITY OF LIGHT PASSING THROUGH DIFFRACTION GRATING A₁
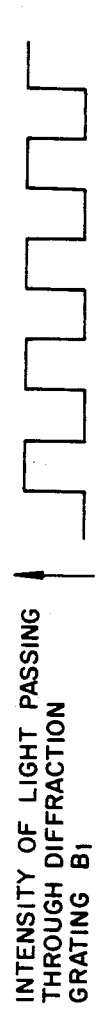
FIG. 4(b) INTENSITY OF LIGHT PASSING THROUGH DIFFRACTION GRATING B₁
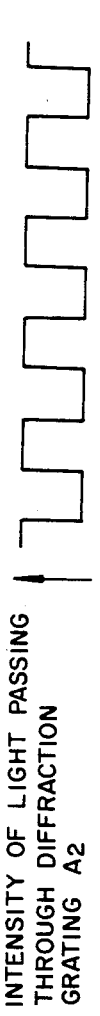
FIG. 4(c) INTENSITY OF LIGHT PASSING THROUGH DIFFRACTION GRATING A₂
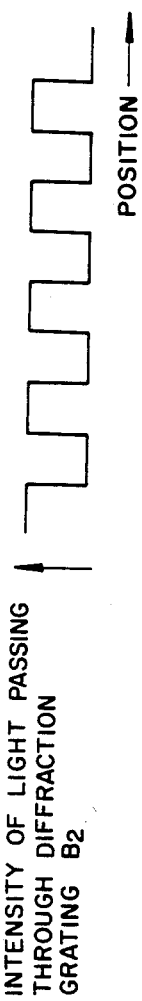
FIG. 4(d) INTENSITY OF LIGHT PASSING THROUGH DIFFRACTION GRATING B₂

OPTICAL SELF-ALIGNMENT SYSTEM

BACKGROUND OF THE INVENTION

This invention relates to an optical positionalignment system for processing minute materials.

The theory, that Moire signals obtained from the light passing through or reflected from a pair of diffraction gratings can be applied to measuring and controlling the displacement of their relative positions, has been proposed by J. Guild in *Diffraction Gratings as Measuring Scales* issued by Oxford U.P. in 1960.

As one of the prior arts in regard to the alignment method by using the theory, there is means to control and reduce Moire signals to a minimum value. However, this means can obtain only restricted accuracy of the alignment because the art makes the alignment by using the point where the signal is naught with respect to the setting position.

As another prior art in regard to the alignment method by using the same theory, there is means to compare ± 1st order diffraction signals of Moire signals. Indeed this means can increase the alignment accuracy up to 20 nm by combining the technique of splitting two bundles of light and receiving the emitted modulation signals with the prior art, however the higher accuracy of alignment might be desired.

SUMMARY OF THE INVENTION

The present invention is intended to dissipate the problem mentioned above.

An object of the present invention is to provide an optical self-alignment system which is simple in constitution and can carry out the alignment with higher accuracy.

The present optical self-alignment system has a pair of substrates placed with an appropriate spacing therebetween, the mutual position of the pair of substrates in a direction parallel to the plane thereof being arranged by the self-alignment system, a first grating plate on one of the two substrates, a second grating plate parallel to the first grating plate, a source of laser which irradiates laser beams to the first grating plate, a position arranging means which arranges the position of either of the two substrates according to Moire signals carried on the laser beams by way of the first grating plate and the second grating plate, and a driving system which shifts either of the two substrates in the direction perpendicular to the grooves of the mentioned gratings by the received control signals transmitted from the position arranging means. The position arranging means comprises; a first diffraction grating segment and a second diffraction grating segment which are formed on the first grating plate, a third diffraction grating segment and a fourth diffraction grating segment which are formed on the second grating plate, a first photoelectric detector which separates and detects the Moire signals from the laser beams coming by way of the first and the third diffraction grating segments, a second photoelectric detector which separates and detects the Moire signals from the laser beams coming by way of the second and the fourth diffraction grating segments, a comparator which compares the detected signals from the first photoelectric detector and the second photoelectric detector, and a controller which delivers the control signals according to the comparison signals from the comparator. When the first grating plate is matched to the second grating plate, the third diffraction grating segment is placed in the position with the delayed phase in respect of the first diffraction grating segment and also the fourth diffraction grating segment is placed in the position with the advanced phase in respect of the second diffraction grating segment.

Therefore the optical self-alignment system of the present invention brings about the following effects and advantages:

(1) The alignment in the setting position with the higher accuracy is possible.
(2) The setting position is always kept steady by compensating the discrepancy between the setting position and a deviated position as soon as the deviation happens.
(3) The line-and-space (pitch) of the diffraction grating can be decided arbitrarily, which makes the pre-arrangement of the alignment possible.
(4) The line-and-space of the diffraction grating can be set in the multiple structure from coarse to fine, which makes the quick alignment with the higher accuracy possible, even if the position before alignment is deviated much far from the setting position.

BRIEF DESCRIPTION OF THE DRAWINGS

FIG. 1 to FIG. 4 show a penetrating type optical self-alignment system as a first embodiment of the present invention;

FIG. 1 is a perspective view showing the whole constitution of the optical self-alignment system;

FIG. 3 is an electric circuit diagram showing the connection between a photoelectric detector and a comparator;

FIGS. 4(a) to 4(d) are graphs showing respectively the intensity of the laser beam by way of grating plates;

DESCRIPTION OF THE PRFERRED EMBODIMENTS

Embodiments of the present invention will now be described referring to the accompanying drawings.

Figure 1:
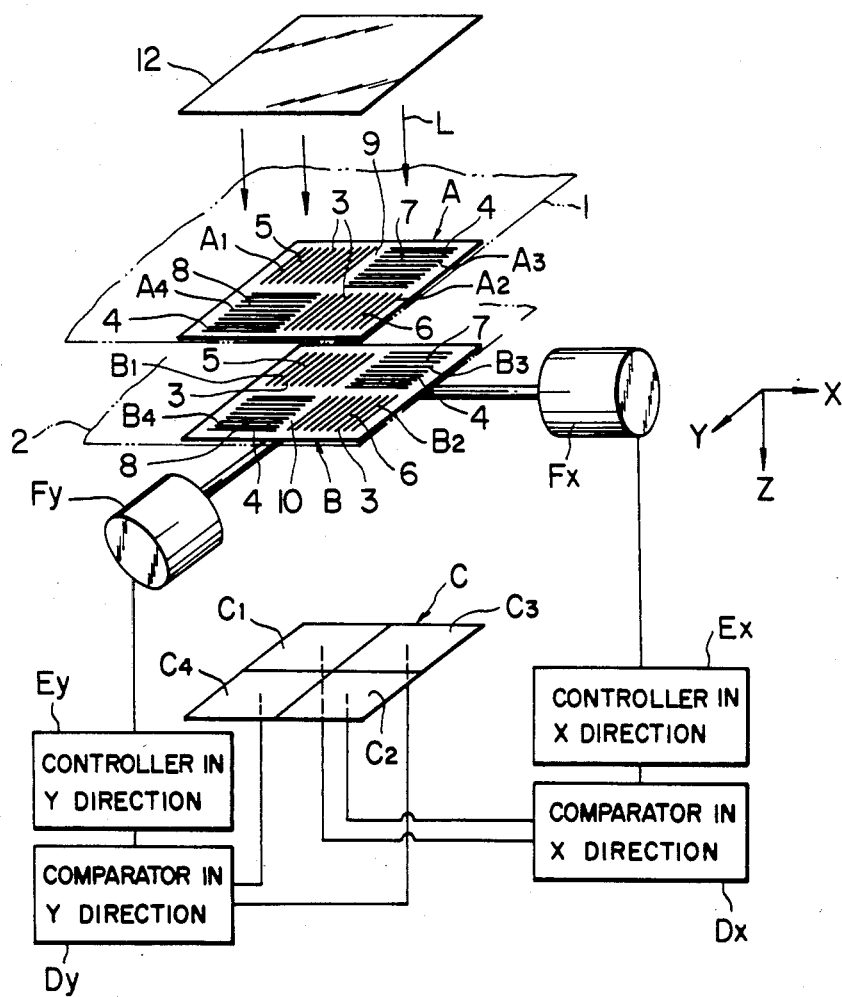

As shown in FIG. 1, the first embodiment of the invention is equipped with a laser light source 12 which supplies parallel laser beam L in the Z direction and to which optical means (not shown) is connected.

The laser beam L is irradiated vertically to a first grating plate A which is attached to a mask 1 used for semiconductor as a substrate.

In parallel with the first grating plate A and also in a required spacing (within the Fresnel zone of the first grating plate A) is provided a second grating plate B which receives the laser beam L penetrating the first grating plate A and which is attached to a semiconductor substrate 2 being the object of the position control.

The laser beam L passing through the second grating plate B is irradiated almost vertically to a photoelectric detector plate C, which is placed within the Fraunhofer's zone and is kept away from the second grating plate B in order that only 0th order diffraction image can be admitted into photoelectric detectors $C_1$–$C_4$ as hereinafter described and 1st order diffraction image is prevented from coming into the detectors $C_1$–$C_4$.

The first grating plate A is marked off by the cross line 9 into four zones of the diffraction grating segments $A_1$, $A_2$, $A_3$, and $A_4$, which belong to diffraction grating suits 3 and 4, and the second grating plate B is marked off by the cross line 10 into four zones of the diffraction grating segments $B_1$, $B_2$, $B_3$ and $B_4$, which belong to the diffraction grating suits 3 and 4.

Namely, in respect of the position arranging means for the X direction alignment, the first diffraction grating segment $A_1$ and the second diffraction grating segment $A_2$ of the first grating plate A belong to the diffraction grating suit 3 and also the third diffraction grating segment $B_1$ and the fourth diffraction grating segment $B_2$ of the second grating plate B belong to the same. In respect of the position arranging means for the Y direction alignment, the first diffraction grating segment $A_3$ and the second diffraction grating segment $A_4$ of the first grating plate A belong to the diffraction grating suit 4 and also the third diffraction grating segment $B_3$ and the fourth diffraction grating segment $B_4$ of the second grating plate B belong to the same.

Four photoelectric detectors (photo diodes) $C_1$, $C_2$, $C_3$ and $C_4$ are installed on the photoelectric detecting plate C.

For the X direction alignment, the laser beam L coming into the first diffraction grating segment $A_1$ passes through the third diffraction grating segment $B_1$, and then is irradiated on the first photoelectric detector $C_1$.

The laser beam L coming into the second diffraction grating segment $A_2$ passes through the fourth diffraction grating segment $B_2$, and then is irradiated on the second photoelectric detector $c_2$.

In the same way, for the Y direction alignment, each of the diffraction grating segments and photoelectric detectors are installed on the grating plates A and B and the photoelectric detecting plate C so as to make the laser beam L travel in such way as $A_3 \rightarrow B_3 \rightarrow C_3$ and $A_4 \rightarrow B_4 \rightarrow C_4$.

Figure 3:
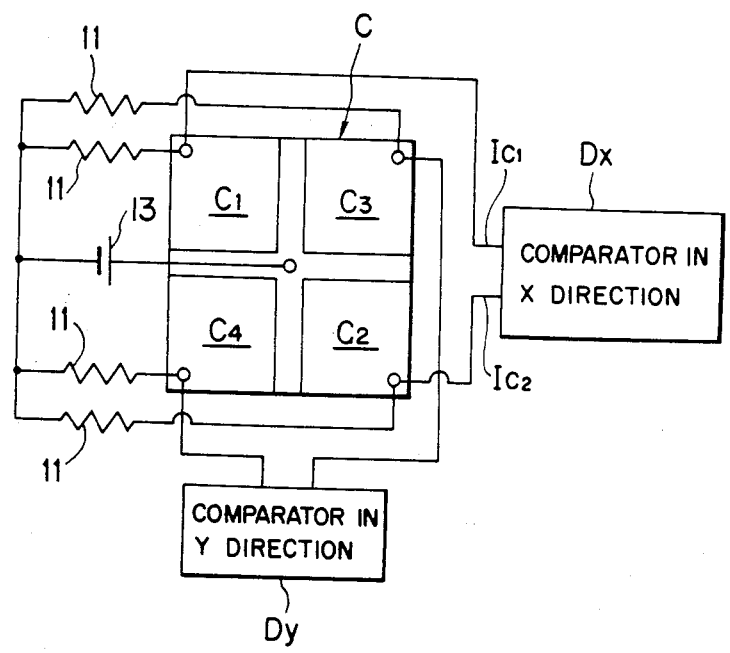

The detected signals detected by the photoelectric detectors $C_1$ and $C_2$ are delivered to a comparator $D_x$ for the X direction alignment respectively as shown in FIG. 3, and the signals compared by the comparator $D_x$ are supplied to a controller (e.g., voltage generator) $E_x$ for the X direction alignment.

The controller $E_x$ for the X direction alignment receives the comparison signals and delivers controlling signals to a driving system (e.g., stacked piezo-electric elements) $F_x$ for the X direction, and then the driving system $F_x$ for the X direction alignment shifts the second grating plate B in the X direction (shown in FIG. 1); the semiconductor substrate 2 is shifted in the X direction.

Each detected signal detected by the photoelectric detectors $C_3$ and $C_4$ is delivered to a comparator $D_y$ for the Y direction and the signals compared by the comparator $D_y$ are supplied to the controller (e.g., voltage generator) $E_y$ for the Y direction.

The controller $E_y$ for the Y direction receives the comparison signals and delivers controlling signals to the driving system $F_y$ (e.g., stacked piezo-electric elements) for the Y direction alignment, and then the driving system $F_y$ for the Y direction shifts the second grating plate B in the Y direction (shown in FIG. 1); the semiconductor substrate 2 is shifted in the Y direction.

The photoelectric detecting plate C comprises 1-chip-split photoelectric elements, and voltage is impressed on the photoelectric detectors $C_1$, $C_2$, $C_3$ and $C_4$ and the intensity of light is detected by the resistor 11.

An amplifier (not shown) and a differential amplifier (not shown) are placed between the photoelectric detectors $C_1$ and $C_2$ and the comparator $D_x$ for the X direction, and also between the photoelectric detectors $C_3$ and $C_4$ and the comparator $D_y$ for the Y direction, respectively. Reference numeral 11 in FIG. 3 designates the resistor and numeral 13 designates the power source.

Figure 2A:
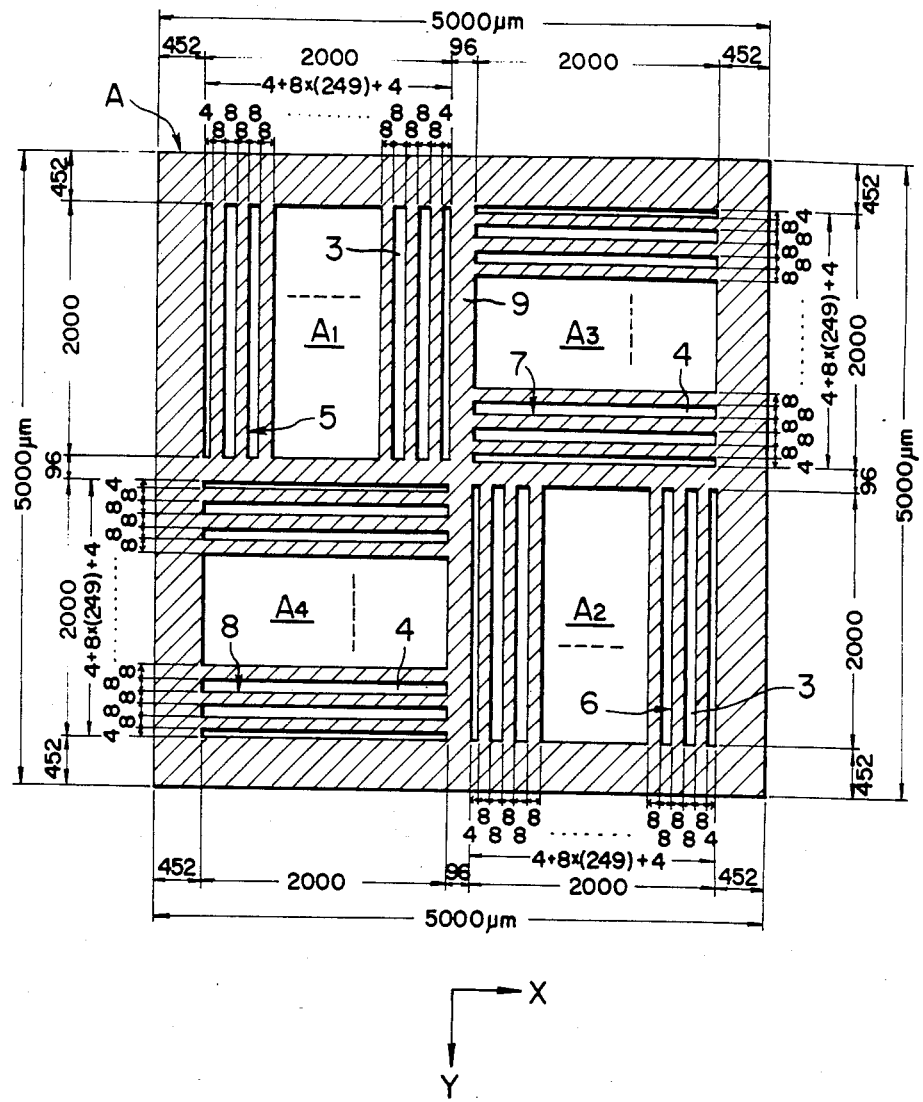
FIG. 2(a) is a descriptive diagram showing its first grating plate.
Figure 2B:
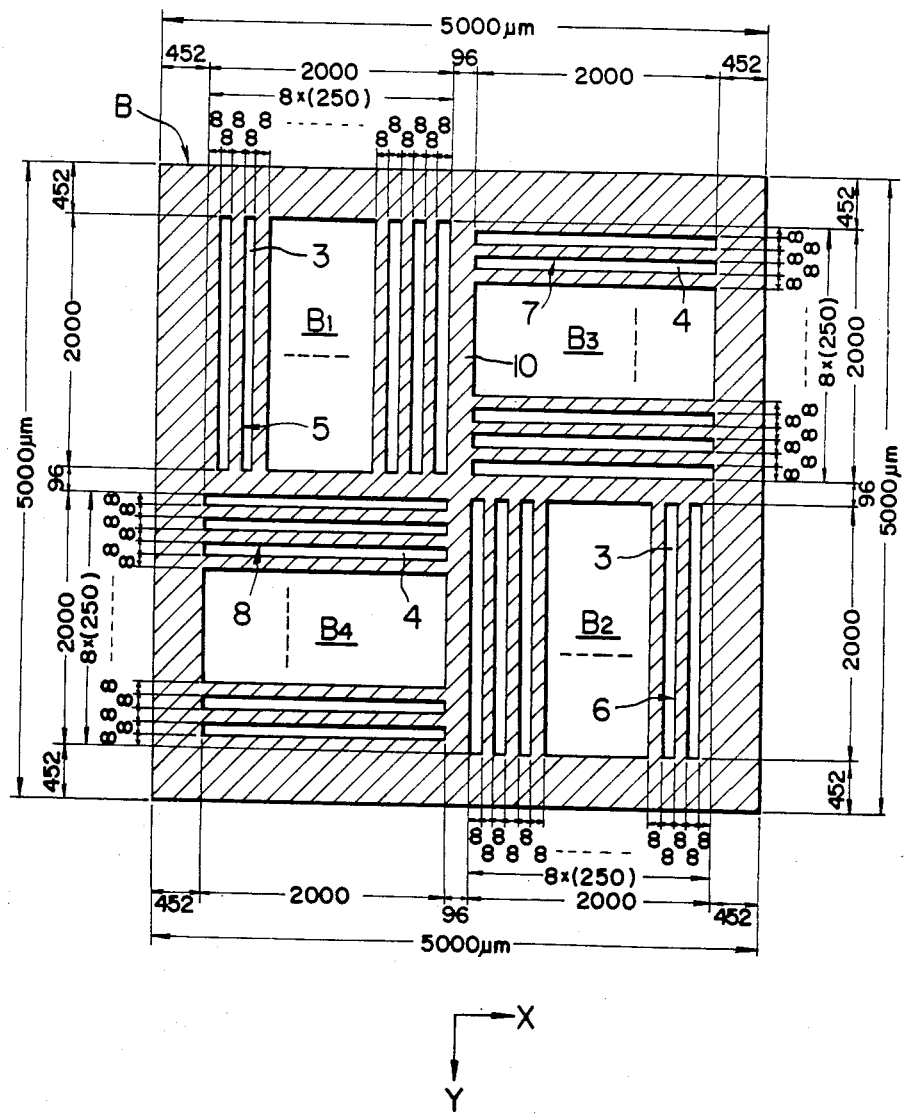
FIG. 2(b) is a descriptive diagram showing its second grating plate.

The detailed explanation about the diffraction grating suits 3 and 4 of the first grating plate A and the second one B is given as follows (referring to FIGS. 2(a) and 2(b)):

Each measurement in FIGS. 2(a) and 2(b) is expressed in $\mu$m unit.

The diffraction grating suits 3 ad 4 with the line-and-space, each width of which is 8 $\mu$m (partially enlarged in FIGS. 2(a) and 2(b)), are grooved by the grooving method of electron beam on the diffraction grating segments $A_1$, $A_2$, $A_3$, $A_4$, $B_1$, $B_2$, $B_3$ and $B_4$, each of which covers area of 2000 $\mu$m by 2000 $\mu$m being made by marking off 5000 $\mu$m $\times$ 5000 $\mu$m grating plates A and B respectively by the cross lines 9 and 10, each width of which is 96 $\mu$m, this width being left in the center part of each of grating plates A and B.

The groove directions of the diffraction grating suits 3 and 4 which are on the diffraction grating segments $A_1$, $A_2$ and $A_3$, $A_4$, respectively are different at a right angle.

The line-and-space phase relations between the diffraction grating segments $A_1$ and $B_1$, and between the diffraction grating segments $A_2$ and $B_2$ are indicated by the intensity of the light passing through each diffraction grating suit on which the laser beam L is irradiated (shown in FIGS. 4(a)–4(d)).

The groove directions of the diffraction grating suits 3 and 4 which are on the diffraction grating segments $B_1$, $B_2$ and $B_3$, $B_4$, are different at a right angle.

With respect to the diffraction grating suits 3 and 4 of the first grating plate A, the line-and-space of the diffraction grating suit 3 and that of the diffraction grating suit 4 have the phase difference by 90°, that is, they have the discrepancy of 4 $\mu$m which is a half of the each width of the line-and-space.

With respect to the diffraction grating suits 3 and 4 of the second grating plate B, the line-and-space of the diffraction grating segment $B_2$ has the phase difference by 180° from the line-and-space of the diffraction grating segment $B_1$, that is, it has the discrepancy of 8 $\mu$m.

In the same way the line-and-space of the diffraction grating segment $B_4$ has the phase difference by 180° from the line-and-space of the diffraction grating segment $B_3$, that is, it has the discrepancy of 8 $\mu$m.

When the cross line 9 of the first grating plate A and the cross line 10 of the second grating plate B are matched each other, the phase of the line-and-space of the diffraction grating segment $A_1$ is delayed by 90° to the phase of the line-and-space of the diffraction grating segment $B_1$, and the phase of the line-and-space of the diffraction grating segment $B_2$ is advanced by 90° to the phase of the line-and-space of the diffraction grating segment $A_2$. Namely, when the mask 1 and the semiconductor substrate 2 are matched, the third diffraction grating segment $B_1$ is placed in a position shifted by an amount of a quarter pitch of the grating in a direction substantially perpendicular to the groove of the grating with respect to the first diffraction grating segment $A_1$.

At the same time, the fourth diffraction grating segment $B_2$ is placed in a position shifted by the same amount as that of a quarter pitch in a direction substantially perpendicular to the groove of the grating with respect to said second diffraction grating segment $A_2$.

In the same way the phase of the line-and-space of the diffraction grating segment $B_3$ is delayed by 90° to the phase of the line-and-space of the diffraction grating segment $A_3$. The phase of the line-and-space of the diffraction grating segment $B_4$ is advanced by 90° to the phase of the line-and-space of the diffraction grating segment $A_4$.

With respect to the position of the line-and-space, the relation between the diffraction grating suit 3 of the diffraction grating segments $A_1$ and $B_1$ and the diffraction grating suit 3 of the diffraction grating segments $A_2$ and $B_2$ represents, as shown in FIGS. 2(a) and 2(b), the relation between the line-and-spaces with phase delayed by 90°, and also the relation between the diffraction grating suit 4 of the diffraction grating segments $A_3$ and $B_3$ and the diffraction grating suit 4 of the diffraction grating segments $A_4$ and $B_4$ represents the relation of the line-and-spaces with phase advanced by 90°, then it may be said that the former refers to "the relation of the diffraction grating suit with the phase delayed by 90°", the latter "the relation of the diffraction grating suit with the phase advanced by 90°".

As an optical self-alignment system as the first embodiment of the present invention consists of those as described above, firstly rough alignment with a range of a few $\mu$m accuracy is done by the conventional way of matching the cross lines with the eye, with using the cross lines 9 and 10 grooved on each of grating plates A and B.

Secondly the Moire signals (0th order Fraunhofer's diffraction light) changing sinusoidally with respect to the position and obtained from a group 5 of the diffraction grating suit 3 of the diffraction grating segments $A_1$ and $B_1$ and a group 6 of the diffraction grating suit 3 of the diffraction grating segments $A_2$ and $B_2$ are detected by the photoelectric detectors $C_1$ and $C_2$ respectively. As the diffraction grating suit 3 of the group 5 is in "the relation of the diffraction grating suit with the phase delayed 90°" and the diffraction grating suit 3 of the group 6 is in "the relation of the diffraction grating suit with the phase advanced by 90°" (shown in FIGS. 2(a) and 2(b)), the Moire signals obtained from these two groups 5 and 6 have the phase difference by 180°.

The comparator $D_x$ for the X direction alignment compares the detected intensities $I_{c1}$ and $I_{c2}$ detected by the photoelectric detectors $C_1$ and $C_2$, and discriminates the difference therebetween or $I_{c1} > I_{c2}$, $I_{c1} < I_{c2}$. The fixed initial voltage $V_0$ is impressed on the stacked piezo-electric elements $F_x$ by the voltage generator $E_x$.

While the comparator $D_x$ judges the difference as $I_{c1} > I_{c2}$, the voltage which is impressed on the stacked piezo-electric elements $F_x$ by the voltage generator $E_x$ is decreased by 1 pulse voltage $\Delta V_0$, in proportion to which the stacked piezo-electric elements $F_x$ are displaced to cause the second grating plate B to shift.

While the comparator $D_x$ judges the difference as $I_{c1} < I_{c2}$, the voltage which is impressed on the stacked piezo-electric elements $F_x$ by the voltage generator $E_x$ is increased by 1 pulse voltage $\alpha V_0$, in proportion to which the stacked piezo-electric elements $F_x$ are displaced, to cause the second grating plate B to shift in the opposite direction to the one mentioned above. The pulse voltage application is stopped around $I_{c1} = I_{c2}$; alignment is so controlled that the intensity of the Moire signals obtained from these two groups 5 and 6 are equal with each other. In this way the alignment at a right angle to the groove of the diffraction grating suit or in the X direction is done.

In the same way, for the Y direction alignment, using the photoelectric detectors $C_3$ and $C_4$, the comparator $D_y$, the voltage generator $E_y$, and the piezo-electric elements $F_y$ the alignment is carried out by detecting the Moire signals obtained from the group 7 of the diffraction grating suit 4 of the diffraction grating segments $A_3$ and $B_3$ and from the group 8 of the diffraction grating suit 4 of the diffraction grating segments $A_4$ and $B_4$. Thus the X direction alignment using the comparator $D_x$ and piezo-electric elements $F_x$ and the Y direction alignment using the comparator $D_y$ and piezo-electric elements $F_y$ are carried out at the same time, thereby effecting a prompt alignment.

The experiment example of the present invention is offered as follows:

In the constitution shown in FIG. 1, helium neon laser with the monochromatic wave length of 632.8 nm is used as the source of laser, and the diffraction grating segments $A_1$, $A_2$, $B_1$ and $B_2$ are used for the diffraction grating suit 3 with line-and-space, each width of which is 100 $\mu$m, the diffraction grating 3 covering area of 5 mm by 5 mm, which is made by the grooving method of the electric beam.

The space between the first grating plate A and the second B is set within the Fresnel zone (e.g., 1 mm), and two pieces of photo diodes are used as the photoelectric elements on the photoelectric detector plate C. The plate C is placed in the Fraunhofer's zone and also is kept away from the second grating plate B (e.g., 1.2 M) in order to admit 0th order diffraction image into the photo diodes $C_1$ and $C_2$ and to prevent 1st order diffraction image from admitting into the photo diodes.

The outputs of the photo diodes $C_1$ and $C_2$ are delivered to the comparator $D_x$ by way of the amplifier and the differential amplifier, and the pulse motor is used as the driving system for the X direction of XY stage with the second grating plate B being fixed to it, and the pulse voltage which causes to drive the pulse motor is generated by the voltage generator $E_x$.

Figure 5:
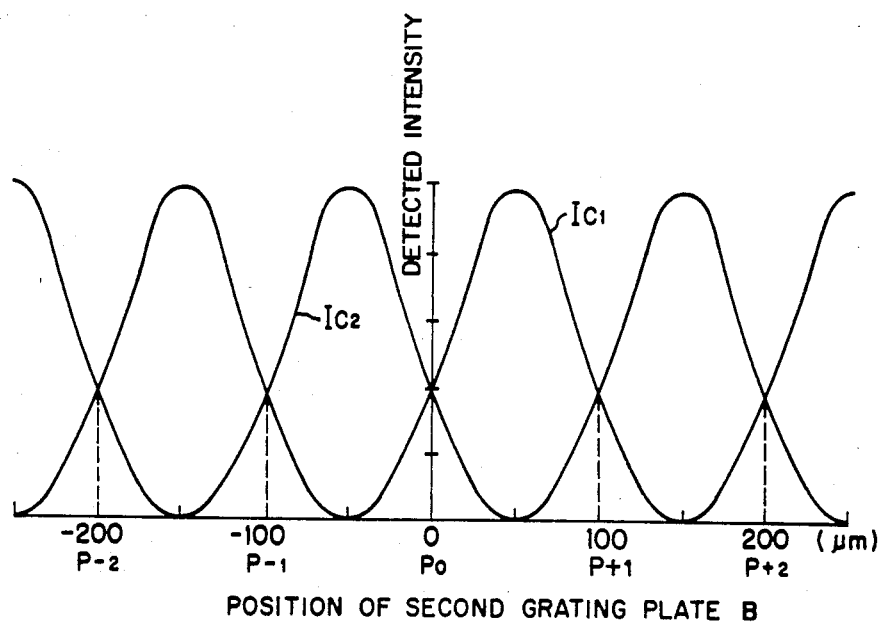
FIGS. 5 to 6 are graphs for explaining the effects observed in the experiment of the system of the present invention.

The experiment of the alignment in the X direction is as follows:

In FIG. 5, the intensity of the Moire signals detected by the photo diodes $C_1$ and $C_2$ and amplified by the amplifier is shown in terms of the ordinate while the relative position of the second grating plate B to the first grating plate A is indicated on the abscissa. FIG. 5 indicates the results of the Moire signals measured while the voltage generator $E_x$ for the X direction alignment is cut off. The reference characters $I_{c1}$ and $I_{c2}$ in FIG. 5 represent the intensities of Moire signals detected by the photo diodes $C_1$ and $C_2$.

Figure 6:
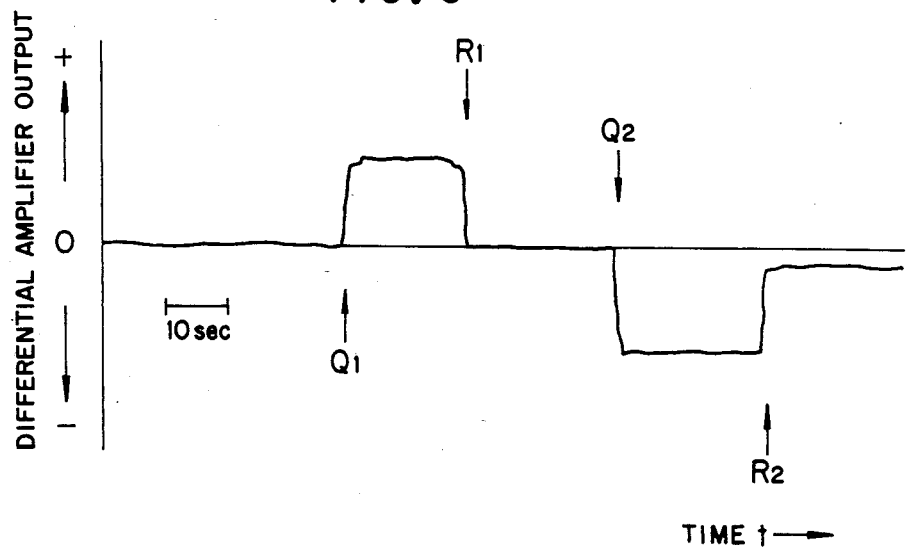

FIG. 6 shows the experiment results indicating the operation properties of the alignment control. That is, the outputs of the differential amplifier for the X direction alignment are recorded on the time axis t in the recording instrument. At the time $Q_1$, the second grating plate B is shifted manually by 10 $\mu$m, while the voltage generator $E_x$ for the X direction alignment being off, from the setting position $P_0$ shown in FIG. 5 to the plus side and at the time $R_1$, the alignment is self-controlled when the voltage generator $E_x$ for the X direction alignment is on. At and the time $Q_2$, the voltage generator $E_x$ for the X direction is turned off again and the second grating plate B is shifted by 10 μm from the setting position $P_0$ to the minus side, and at the time $R_2$, the alignment is self-controlled when the voltage generator $E_x$ for the X direction is turned on again.

Referring to FIG. 5, the operation principle of the present invention is explained according to the experiment examples as follows. In this experiment, by using the two groups 5 and 6 of the diffraction grating suit, which are in "the relation of the diffraction grating suit with the phase delayed by 90°" and in "the relation of the diffraction grating suit with the phase advanced by 90°" respectively, the detected intensities $I_{c1}$ and $I_{c2}$ of Moire signals changing sinusoidally according to the relative position of the diffraction grating suit indicate the phase difference by 180°. Therefore the position of the second grating plate B where the detected intensity difference of Moire signals ($I_{c1}-I_{c2}$) becomes zero, is obtained at 100 μm intervals like . . . , $P_{-2}$, $P_{-1}$, $P_0$, $P_{+1}$, $P_{+2}$, . . . The setting position is one of them, and in this case, $P_0$ represents the setting position.

While the present position of the second grating plate B is shifted to the plus side and in the range between $P_0$ and $P_{+1}$, the detected intensity difference of Moire signals ($I_{c1}-I_{c2}$) becomes plus and the decision $I_{c1}>I_{c2}$ is delivered from the comparator $D_x$. Then the voltage generator $E_x$ delivers the pulse voltage, enable the pulse motor to rotate rightward and to shift the second grating plate B to the minus side.

While the second grating plate B is shifted to the minus side and in the range between $P_0$ and $P_{-1}$, the detected intensity difference of Moire signals ($I_{c1}-I_{c2}$) becomes minus and the decision $I_{c1}<I_{c2}$ is delivered from the comparator $D_x$. Then the voltage generator $E_x$ delivers the minus voltage, enable the pulse motor to rotate leftward and to shift the second grating plate B to the plus side.

But when the second grating plate B is positioned much near the setting position $P_0$, the detected intensity difference of Moire signals ($I_{c1}-I_{c2}$) becomes nearly zero, and neither the decision $I_{c1}>I_{c2}$ nor $I_{c1}<I_{c2}$ is delivered from the comparator $D_x$. Then the voltage generator $E_x$ delivers no pulse voltage cause the second grating plate B to be kept in its own position.

The plate A as the shiftable grating plate is also treated similarly.

The alignment accuracy in the X direction depends on the size of the displacement which consists of the displacement caused by 1 pulse delivered from the voltage generator $E_x$ to both sides of the setting point and the displacement caused by noise.

When the intensity $I_{c1}$ and $I_{c2}$ of Moire signals are given the same intensity properties except that only the phase is delayed by 180° as shown in FIG. 5, the signal displacement becomes great at the setting point and the detected intensity difference of Moire signals ($I_{c1}-I_{c2}$) is obtained with higher ratio of signal to noise.

Therefore, although the detected intensity difference of Moire signals ($I_{c1}-I_{c2}$) is small, the ratio of signal to noise is high, so the multitude of the detected intensity of Moire signals $I_{c1}$ and $I_{c2}$ can be judged and the alignment accuracy is improved.

The experiment results shown in FIG. 5 indicate that the possible range for the alignment at the setting position is around ±100 μm.

Generally the possible range for the alignment at the setting position from each side is approximately as much as the width of the line-and-space of the diffraction grating suit with resepct to each side.

At present the line-and-space, each width of which is 4 μm for the diffraction grating suit is accurately made by the grooving method of the electron beam. If the range with ±4 μm from the setting position can be detected in the ratio of signal to noise of 500, the alignment accuracy of 5 nm will be expected.

As shown in FIGS. 5 and 6, this experiment examples indicate the operation of the present invention, that is, the alignment to a setting position is self-controlled around near the setting position and is kept in the setting position. FIG. 6 indicates that the alignment is self-controlled to get the setting position even if the displacement of the position is done manually from the setting position $P_0$ towards the plus side or the minus.

In the experiment the operation of the alignment in the X direction only is shown, however, the similar operation can be also carried out in the Y direction.

Figure 7:
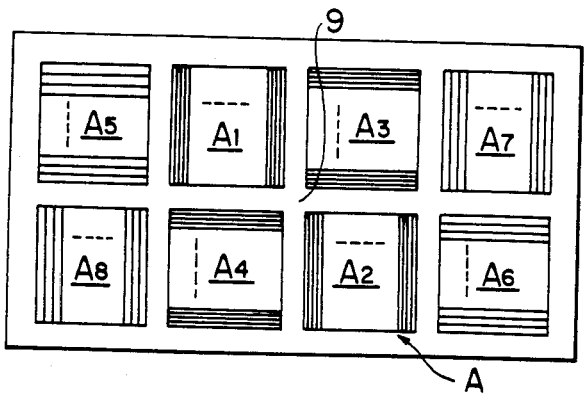
FIG. 7 is a descriptive diagram showing modification of the diffraction grating segment, or the frist grating plate having two stages of the line-and-space.

When the width of the line-and-space of the diffraction grating suit gets smaller, the range of alignment becomes smaller, but the alignment accuracy can be expected to be improved. In this view point, as shown in FIG. 7, the line-and-space of the diffraction grating suit may be made with two kinds of width 2 μm and 100 μm.

In the first step, the alignment is carried out by the pulse motor as the first driving system by using the first diffraction grating segments $A_5$–$A_8$ and the second diffraction grating segments (not shown) with the line-and-space, each width of which is 100 μm.

In the second step, on the other hand, the highly accurate alignment is done by the stacked piezoelectric element driving system as the second driving system by using the first diffraction grating segments $A_1$–$A_4$ and the second diffraction grating segments $B_1$–$B_4$ with the line-and-space, each width of which is 2 μm.

In this way, in spite of the wide range of alignment obtained by to the provision of the line-and-space, each width of which is 100 μm, also highly accurate and automatic alignment can be obtained due to the use of another kind of line-and-space at the same time.

Figure 8:
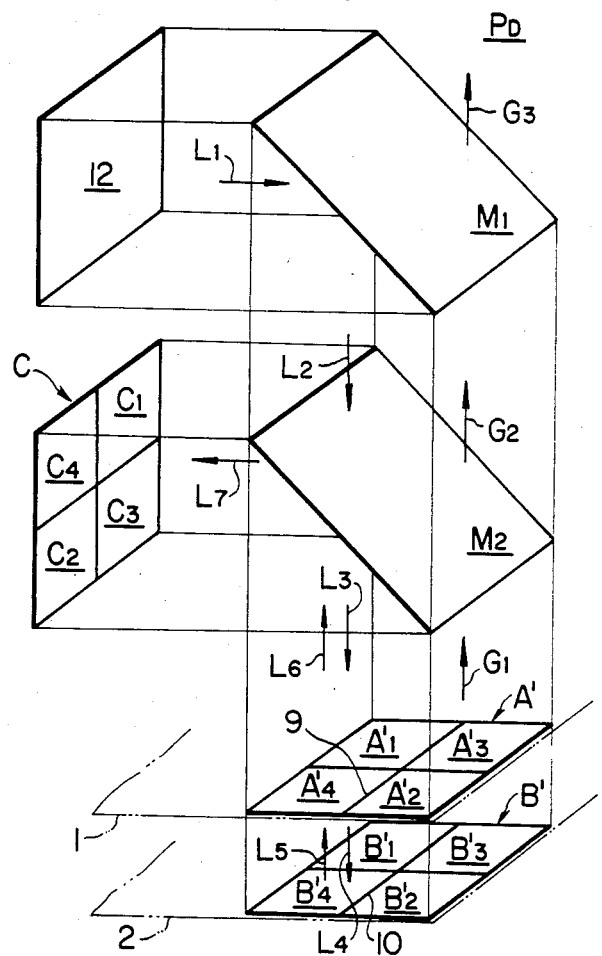
FIG. 8 is a perspective view showing the whole constitution of a reflecting type optical self-alignment system as a second embodiment of the present invention.

In the reflection type optical self-alignment system as a second embodiment of the present invention, as shown in FIG. 8, with respect to the first grating plate $A'$, the first and second diffraction grating segments $A'_1$ and $A'_2$ for the X direction alignment and the first and second diffraction grating segments $A'_3$ and $A'_4$ for the Y direction alignment are all formed as the diffraction grating segments of the partially transparent reflection type, and also with respect to the second grating plate $B'$, the third and fourth diffraction grating segments $B'_1$ and $B'_2$ for the X direction alignment and the third and fourth diffraction grating segments $B'_3$ and $B'_4$ for the Y direction alignment are all formed as the diffraction grating segments of the reflection type. The first half mirror $M_1$ is placed between the source of laser 12 and the first grating plate $A'$, and the second half mirror $M_2$ is placed so as to receive the reflected laser beam from the second grating plate $B'$ and to reflect the laser beam to the photoelectric detecting plate C.

Like reference characters shown in FIGS. 1–7 designate like or corresponding parts in FIG. 8, and in the second embodiment the composition of the other parts are almost like to those of the first embodiment.

Therefore in the second embodiment the cross line 9 on the first grating plate A' and the cross line 10 on the second grating plate B' are matched each other with the eye by using the passing beam through each half mirror $M_1$ and $M_2$ along the beam lanes $G_1$, $G_2$ and $G_3$ (shown in FIG. 8). Instead of the eye measurement, the detector may be placed at the position $P_D$.

In this way, after the rough alignment of the first and second grating plates A' and B', the highly accurate alignment can be carried out by like operation shown in the first embodiment.

During the operation described above, the laser beam L travels on according to the order of the reference characters in FIG. 8, i.e., $L_1 \rightarrow L_2 \rightarrow L_3 \rightarrow L_4 \rightarrow L_5 \rightarrow L_6 \rightarrow L_7$ or $L_1 \rightarrow L_2 \rightarrow L_3 \rightarrow L_6 \rightarrow L_7$, and the Moire signals are detected by the first and the second photoelectric detectors $C_1$ and $C_2$ for the X direction alignment on the photoelectric detecting plate C and also by the first and second photoelectric detectors $C_3$ and $C_4$ for the Y direction alignment.

In this way, the highly accurate alignment can be carried out only by forming previously the second grating plate B' of the reflecting type on the semiconductor substrate 2 which is the object of the position control and by receiving and reflecting the laser beam on one side of the semiconductor substrate 2.

In this second embodiment, the object of the position control is not limited only to the semiconductor substrate but is extended to anything like the video head needing the highly accurate alignment.

As shown in the embodiments and experiments described previously, the system of the present invention using two groups of diffraction grating suits in "the relation of the diffraction grating suit with the phase delayed by 90°" and also in "the relation of the diffraction grating suit with the phase advanced by 90°" respectively, has the phase difference of the obtained Moire signals by 180° and achieves a large displacement obtained in the setting position where the alignment is carried out. By utilizing the properties of the two groups' difference of the detected intensities of the Moire signals, the control signals which decide whether the operation of the driving system should be carried out and which direction the operation should be done can be obtained.

The diffraction grating suits used here may be grooved in the arbitrary position on the substrate, but can be easily and neatly grooved on the part used for the matching cross lines by applying the grooving method of the electron beam. Therefore this system is simple indeed in constitution but has the advantageous functions which can make the highly accurate alignment possible and also keep the required position steady.

With respect to the phase delay and advance, they can be determined arbitrarily but the sum of their absolute values should be 180°.

What is claimed is:

1. An optical self-alignment system which adjusts relative position between a pair of substrates spaced at a predetermined distance, said self-alignment system comprising:
    a first grating plate installed on one of said two substrates;
    a second grating plate installed on the other of said two substrates and in parallel to said first grating plate;
    a laser source for irradiating laser beams to said first grating plate;
    position arranging means for arranging the relative position of said two substrates according to Moire signals carried on the laser beams passing through said first and second grating plates;
    said position arranging means including first and second diffraction grating segments formed on said first grating plate, third and fourth diffraction grating segments formed on said second grating plate, a first photoelectric detector for detecting Moire signals carried on the laser beams passing through said first and third diffraction grating segments, a second photoelectric detector for detecting Moire signals carried on the laser beams passing through said second and fourth diffraction grating segments, a comparator for comparing the detected signals from said first and second photoelectric detectors so as to produce comparison signals, and a controller for delivering control signals according to the comparison signals from said comparator; and
    a driving system responsive to the control signals for shifting either of said two substrates in a required direction until shifted by an amount of a part of one pitch of the grating in a direction substantially perpendicular to the alignment of the grating with respect to said first diffraction grating segment and until said fourth diffraction grating segment is placed in a position shifted by the same amount of the part of one pitch of the grating in a direction substantially perpendicular to the alignment of the grating with respect to said second diffraction grating segment so that said first and second grating plates are matched.

2. An optical self-alignment system as set forth in claim 1, wherein said first and second diffraction grating plates are disposed within the Fresnel zone 3. An optical self-alignment system as set forth in claim 1, wherein said first and second photoelectric detectors are arranged within the Fraunhofer's zone of 0th order with respect to said second diffraction grating plate.

4. An optical self-alignment system as set forth in claim 1, wherein said first and second diffraction grating segments and said third and fourth diffraction grating segments comprise penetrating type diffraction grating segments.

5. An optical self-alignment system as set forth in claim 1, wherein said first and second diffraction grating segments and said third and fourth diffraction grating segments comprise reflecting type diffraction grating segments.

6. An optical self-alignment system as set forth in claim 1, wherein said controller delivers said control signal to said driving system so that said comparison signal from said comparator becomes zero.

7. An optical self-alignment system as set forth in claim 1, wherein the sum of the shifting amount of said third diffraction grating segment and said fourth diffraction grating segment is a half of the grating pitch.

8. An optical self-alignment system as set forth in claim 1, wherein at least two sets of said diffraction grating segments are provided on said first and second grating plates, and the line-and-space of said diffraction grating segments are grooved in different pitch.

9. An optical self-alignment system as set forth in claim 1, wherein said driving system operates in different step motions of different traveling amounts.

10. An optical self-alignment system as set forth in claim 1, wherein said driving system shifts said substrates in two directions perpendicular to each other, and said position arranging means delivers said control signals to said driving system so as to adjust the driving amount thereof in each of the two directions.

11. An optical self-alignment system as set forth in claim 10, wherein the first and second grating plates include cross lines for dividing the diffraction grating segments from each together.

12. An optical self-alignment system comprising: first and second plates facing each other and being relatively movable in a certain direction; first and second diffraction grating means comprised of line-and-space shapes having the same period and arranged perpendicular to the certain direction on the first plate; third and fourth diffraction grating means comprised of line-and-space shapes having the same period as that of the first and second diffraction grating means and having a predetermined phase difference therebetween and arranged perpendicular to the certain direction on the second plate, the third diffraction grating means corresponding to the first diffraction grating means, and the fourth diffraction grating means corresponding to the second diffraction grating means; a light source for irradiating monochromatic rays to the pair of first and third diffraction grating means and to the pair of second and fourth diffraction grating means so as to produce first and second Moire signals representative of relative displacements between the first and third diffraction grating means and between the second and fourth diffraction grating means, respectively; control means responsive to the first and second Moire signals for producing a control signal representative of an intensity difference between the first and second Moire signals; and drive means responsive to the control signal for relatively moving the first and second plates in the certain direction until the intensity difference reaches a predetermined value so that the first and second plates are matched.

13. An optical self-alignment system as set forth in claim 12; wherein the drive means includes means for relatively moving the first and second plates in the certain direction until the intensity difference reaches zero so that the amount of relative displacement between the first and third diffraction grating means coincides with the amount of relative displacement between the second and fourth diffraction means.

14. An optical sefl-alignment system as set forth in claim 13; wherein the third and fourth diffraction grating means have a phase difference of 180° therebetween.

15. An optical self-alignment system as set forth in claim 14; whrein the drive means includes means for relatively moving the first and second plates until the intensity difference reaches zero so that the phase of the third diffraction grating means is controlled to advance by 90° relative to the first diffraction grating emans and the phase of the fourth diffraction grating means is controlled to delay by 90° relative to the second diffraction grating means.

16. An optical self-alighment system as set forth in claim 12; wherein the second plate is located within the Fresnel zone with respect to the first plate so as to produce the first and second Moire signals.

17. An optical self-alignment system as set forth in claim 12; wherein the control means comprises first and second detecting means for detecting the intensities of the first and second Moire signals, respectively.

18. An optical self-alighment system as set forth in claim 17; wherein the first and second detecting means are located within the Fraunhofer's zone of 0th order with respect to the second plate.

19. An optical self-alignment system as set forth in claim 17; wherein the first and second detecting means comprise photoelectric detectors.

20. An optical self-alignment system as set forth in claim 17; wherein the control means comprises a comparator connected to the first and second detecting means for comparing the intensities of the first and second Moire signals.

21. An optical self-alignment system as set forth in claim 12; wherein the first, second, third and fourth diffraction grating means comprise penetrating type diffraction grating segments.

22. An optical self-alignment system as set forth in claim 12; wherein the first, second, third and fourth diffraction grating means comprise reflecting type diffraction grating segments.

23. An optical self-alignment system as set forth in claim 12; wherein each of the first, second, third and fourth diffraction grating means comprises a larger period portion of the line-and-space shape and a smaller period portion of the line-and-space shape.

24. An optical self-alignment system as set forth in claim 12; wherein the first and second plates are relatively movable in two orthogonal directions, and each of the first, second, third and fourth diffraction grating means comprises a pair of diffraction grating segments aligned orthogonal with each other for aligning the first and second plates in two directions.

25. An optical self-alignment system as set forth in claim 24; wherein the first and second plates include cross lines for enabling manual aligning of the first and second plates.

26. An optical self-alignment system as set forth in claim 25; wherein the cross lines divide the diffraction grating segments from each other on the first and second plates.

* * * * *